United States Patent [19]

Nakanisi et al.

[11] 4,348,981
[45] * Sep. 14, 1982

[54] VERTICAL TYPE VAPOR-PHASE GROWTH APPARATUS

[75] Inventors: Takatosi Nakanisi, Hachioji; Atsushi Tanaka; Takashi Udagawa, both of Yokohama, all of Japan

[73] Assignee: Tokyo Shibaura Denki Kabushiki Kaisha, Kawasaki, Japan

[*] Notice: The portion of the term of this patent subsequent to Sep. 22, 1998, has been disclaimed.

[21] Appl. No.: 228,350

[22] Filed: Jan. 26, 1981

Related U.S. Application Data

[62] Division of Ser. No. 54,949, Jul. 5, 1979, Pat. No. 4,290,385.

[30] Foreign Application Priority Data

Jun. 14, 1979 [JP] Japan ................... 54-75049

[51] Int. Cl.$^3$ ............................................ C23C 11/00
[52] U.S. Cl. ........................................ 118/730; 118/900
[58] Field of Search ............... 118/715, 728, 729, 730, 118/900; 427/251, 255.5; 148/175; 156/613

[56] References Cited

U.S. PATENT DOCUMENTS

| | | | |
|---|---|---|---|
| 3,231,337 | 1/1966 | Barkemeyer et al. | 148/175 X |
| 3,297,501 | 1/1967 | Reisman | 156/613 |
| 3,338,761 | 8/1967 | Cheney et al. | 148/175 |
| 3,406,048 | 10/1968 | Immendorfer et al. | 148/175 |
| 3,675,619 | 7/1972 | Burd | 118/730 X |
| 3,745,969 | 7/1973 | Huffman et al. | 118/730 |
| 4,290,385 | 9/1981 | Nakanisi et al. | 118/730 |

FOREIGN PATENT DOCUMENTS

770834 10/1967 Canada ................... 118/715
49-44788 11/1974 Japan.

OTHER PUBLICATIONS

*IBM Technical Disclosure Bulletin*, "Producing Epitaxial Germanium Deposits," Hornberger, Oct. 1966, vol. 9, No. 5, pp. 538, 539.
*J. of the Electrochemical Soc.*, "The Use of Metal Organics in the Preparation of Semiconductor Materials," Manasevit et al; vol. 116, No. 12, pp. 1725-1732, Dec. 1969.
*J. of the Electrochemical Soc.*, "Properties of Epitaxial Gallium Arsenide from Trimethylgallium and Arsine," Ito et al., pp. 419-423, Oct. 1973.

*Primary Examiner*—Evan K. Lawrence
*Attorney, Agent, or Firm*—Oblon, Fisher, Spivak, McClelland & Maier

[57] ABSTRACT

A vertical type vapor-phase growth apparatus comprises a vapor-phase growth reactor constituted of an upper section defining an upper chamber having a lateral cross-section of about 200 cm$^2$ and a lower section defining a lower chamber having a lateral cross-sectional area greater than, but smaller than four times the cross-sectional area of, the upper chamber, and a support for a semiconductor substrate disposed within the lower chamber. The support is in the form of a silicon plate on which a sample is directly placed.

6 Claims, 10 Drawing Figures

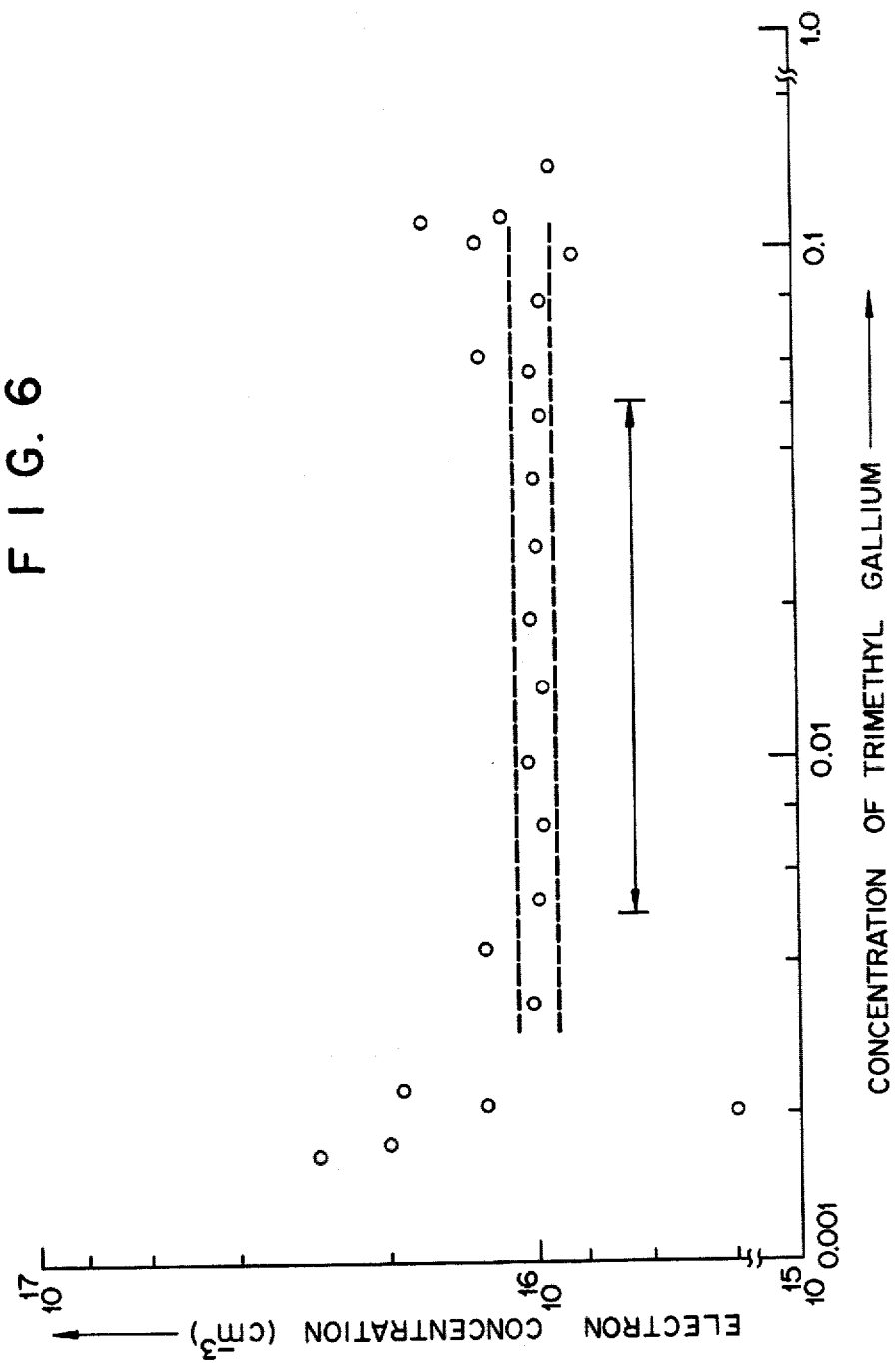

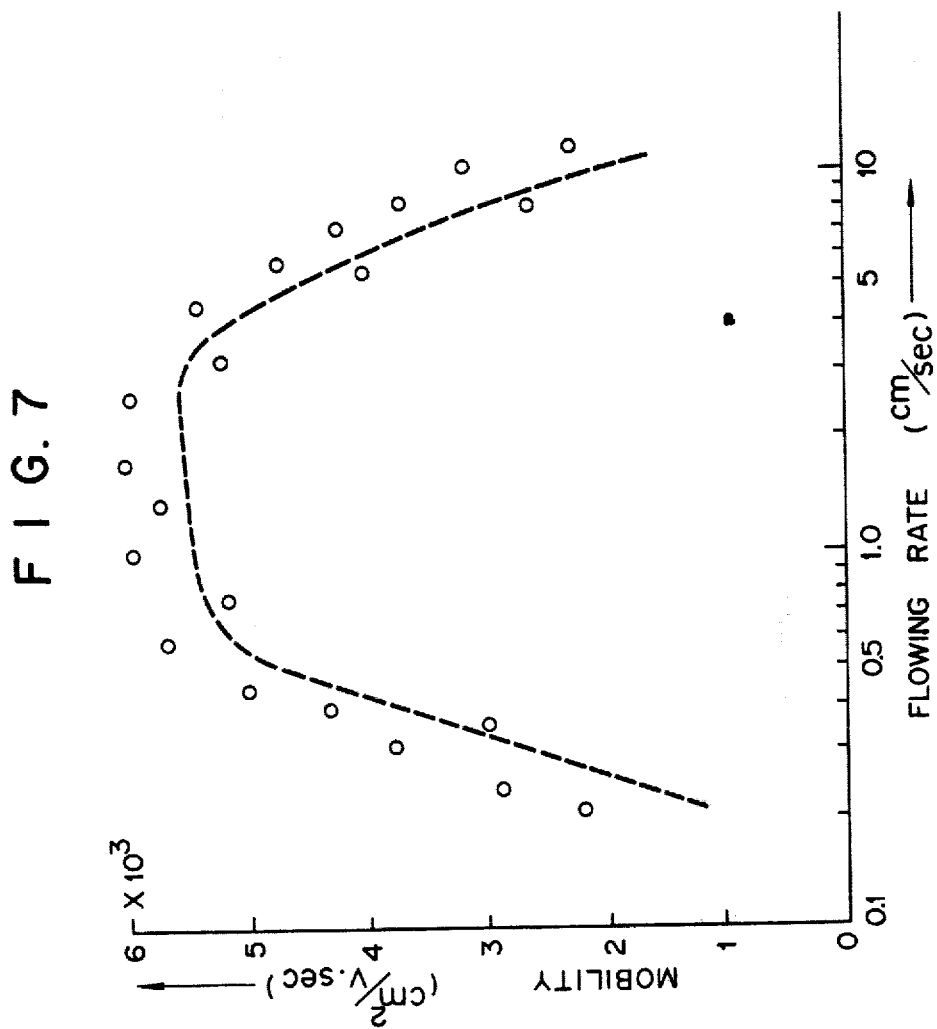

VERTICAL TYPE VAPOR-PHASE GROWTH APPARATUS

This is a continuation, division, of application Ser. No. 054,949 filed July 5, 1979, U.S. Pat. No. 4,290,385.

BACKGROUND OF THE INVENTION

This invention relates to a vertical type vapor-phase growth apparatus suitable for the vapor-phase growth of a compound semiconductor layer of gallium arsenide or a material including gallium arsenide as a main component.

As a method for effecting the vapor-phase growth of a compound semiconductor layer such as gallium arsenide (GaAs), a method utilizing the thermal cracking of trimethyl gallium (TMG) (one kind of organic gallium) and arsine (AsH$_3$) (hydrogen arsenide) is known. In the carrying out of such growth method, a vertical type vapor-phase growth reactor has recently come to be used in place of a horizontal type, because no greater amount of feed gas is necessary. In the vertical type reactor a feed gas is supplied substantially vertically down onto samples i.e. crystal substrates and, since the direction in which the feed gas is supplied is the same as the direction in which a vapor-phase growth is effected, such vapor-phase growth can be effected with a lesser amount of feed gas. Since in the vertical type reactor a fairly greater spacing is required between the crystal substrate and a gas inlet hole provided above a crystal substrate bearing support, some gas heated in the neighborhood of the substrate ascends, thus producing a convection phenemenon and involving the following problems:

(1) A variation in the thickness of a growth layer occurs, because a uniform flow of gas in the reactor is prevented;

(2) Some spent gas is reversely flowed toward the upstream portion of the reactor to cause contamination of the feed gas.

(3) The thermal cracking of the fresh feed gas occurs by some heated gas flowed to the upper portion of the reactor, yielding products other than a desired gallium arsenide. As a result, the rate of growth of the vapor-phase growth layer is slowed down.

If such convection occurs within the reactor, the uniformity of the thickness of the growth layer is impeded and, moreover, the layer is formed only at a slower rate of a growth and in lower purity. The effects of the convection are prominently observed as the inner diameter of the reactor is increased, and it has been customary in the prior art to use a reactor having an inner diameter of about 6 cm. For this reason, it is impossible to form a number of growth layers one at a time and thus good productivity, i.e. the theoretical feature of a thermal-cracking vapor-phase growth method can not be expected in the conventional vertical type reactor.

SUMMARY OF THE INVENTION

It is accordingly the object of this invention to provide a vertical type vapor-phase growth reactor which may form high-purity growth layers at uniform thickness in high yield with a lesser amount of feed gas, but with good operability.

The vapor-phase growth reactor is constituted of an upper section defining an upper chamber having a lateral cross-section of about 200 cm$^2$ and a lower section defining a lower chamber having a lateral cross-sectional area greater than, but smaller than four times the cross-sectional area of, the upper chamber, and a support for a semiconductor substrate disposed in the lower chamber. The support is in the form of a silicon plate on which a sample is directly placed.

BRIEF DESCRIPTION OF THE DRAWINGS

This invention will be further described by way of example by referring to the accompanying drawings in which:

FIG. 6 is a graph showing a relation of a variation in the electron concentration of a growth layer to a variation in the concentration of trimethyl gallium in a mixed gas; and FIG. 7 is a graph showing a relation of a variation in mobility of a growth layer at room temperature to a change in a rate of flow of a mixed gas.

PREFERRED EMBODIMENT OF THE INVENTION

A gallium-arsenide vapor-phase growth method will be explained in connection with a vertical type vapor growth apparatus according to one embodiment of the invention by referring to the accompanying drawings.

Figure 1:
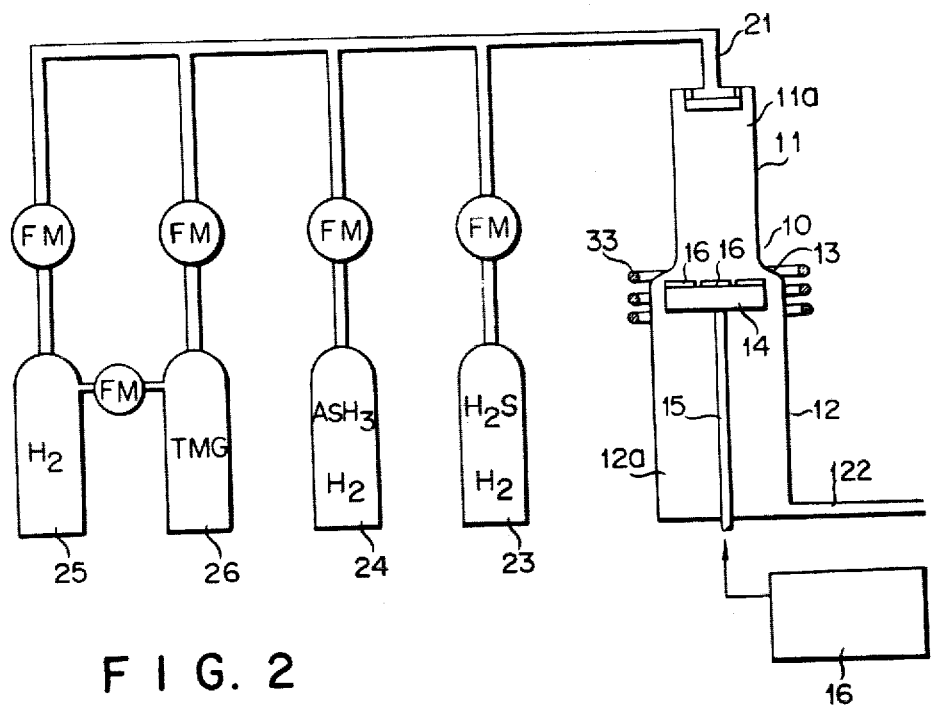
FIG. 1 is a view generally showing a vapor-phase growth apparatus according to one embodiment of this invention.
Figure 2:
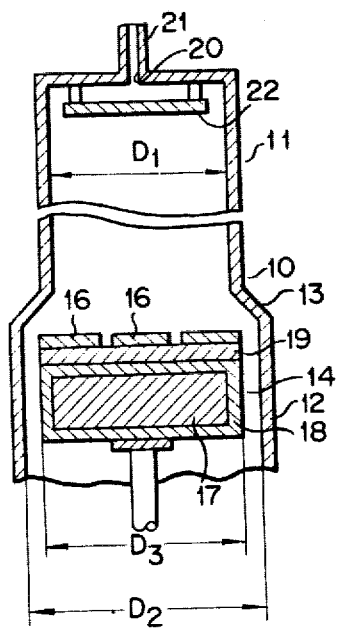
FIG. 2 is a cross-sectional view, partly broken away, showing a major part of the apparatus of FIG. 1

In FIGS. 1 and 2, reference numeral 10 shows a vapor growth reactor comprising a smaller-diameter upper cylindrical reactor section 11, a larger-diameter lower cylindrical reactor section 12, and a joining taper section 13 connecting the upper and lower sections in concentric fashion. The reactor is made of transparent quartz. The upper reactor section 11 has an upper cylindrical chamber 11a with an inner diameter D$_1$ of about 10 cm and a lateral cross-sectional area of 10$^2 \times \pi/4$cm$^2$ and the lower reactor section 12 has a lower cylindrical chamber 12a with an inner diameter D$_2$ of about 15 cm and a lateral cross-sectional area of 15$^2 \times \pi/4$cm$^2$. A support 14 is disposed within the lower chamber 12a and near the upper chamber 11a. The support 14 is fixed on a shaft 15 and rotated by the shaft 15 which in turn is rotated by a motor 16. In this embodiment, a plurality of samples, e.g. gallium arsenide substrates are disposed on the support 14. The support 14 comprises a body 17 made of graphite, a protective layer 18 made of silicon carbide and covering the outer surface of the body 17, and a detachable silicon plate 19 on the protective layer 18. Vapor growth is effected with gallium arsenide substrates on the silicon plate 19. The support 14 may be formed of a column body having an outer diameter greater than the inner diameter of the upper chamber 11a and smaller than the inner diameter of the lower chamber 12a. The support 14 is arranged concentric with the lower reactor section such that the outer surface thereof is spaced equidistantly from the inner surface of the lower chamber 12a. A gas inlet 20 is provided at the central portion of the top wall of the upper reactor section 11 and a gas introducing duct 21 is connected to the gas inlet 20. A gas is introduced through the gas introducing duct 21. A diffusion plate 22 made of transparent quartz is provided within the upper chamber 11a such that it is spaced a predetermined distance from the inner surface of the top wall of the upper reactor rection 11. The diffusion plate 22 is disc-like in configuration and disposed concentric with the gas inlet hole 20 such that the outer peripheral surface thereof is equally spaced a smaller distance from the inner surface of the upper chamber 11a. The diffusion plate has the function of diffusing the gas from the gas inlet. A gas discharge duct 122 is connected to the lower portion of the lower reactor section 12. The gas from the gas introducing duct 21 flows down the reactor and is discharged through the gas discharge duct 122. A gas supply source is connected through a flow rate control valve to the gas introducing duct. In this embodiment the gas supply source includes a source 23 for supplying a hydrogen sulfide ($H_2S$) gas, as a doping gas, which is diluted with hydrogen, a source 24 for supplying an arsine ($AsH_3$) gas diluted with hydrogen, a hydrogen gas ($H_2$) supply source 25 and a source 26 for supplying trimethyl-gallium (TMG) vaporized by the hydrogen gas from the hydrogen gas ($H_2$) supply source 25. The hydrogen sulfide ($H_2S$) and trimethyl gallium (TMG) are thermally cracked within the reactor to permit the vapor growth of gallium arsenide. In this case the hydrogen gas acts as a carrier gas. Reference numeral 33 in FIG. 1 shows an RF coil for heating the sample to a growth temperature through the support 14.

Figure 2A:
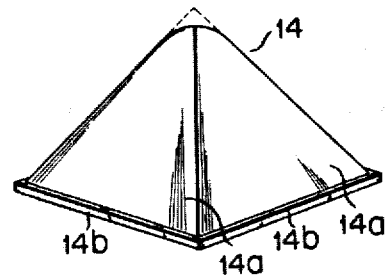
FIG. 2A is a side view showing a modified form of support used in the apparatus of FIG. 1.

Although in this embodiment the top surface of the support 14 is flat, it may be formed three-dimensionally as shown in FIG. 2A to permit more samples to be vapor-phase grown at a time. In this example, use is made of a support 14 of a quadrangular pyramid having four inclined side faces 14a on which samples are placed. A rib 14b is provided at each of the base edges of the quadrangular pyramid to prevent a drop down of the sample. The peak of the quadrangular pyramid is rounded to permit a mixed gas to be distributed uniformly over the side faces of the quadrangular pyramid.

The formation of a gallium arsenide growth layer will be explained below using the growth reactor as mentioned above.

EXAMPLE 1

Gallium-arsenide high-resistance substrates each having a mirror-polished main surface with an area of 10 $cm^2$ and a face orientation (100) were washed with an organic solvent and chemically etched with a sulfuric acid-based etching solution. It is preferable to use a gallium arsenide substrate with a face orientation (100)±5°. A plurality of such substrates were placed on the support 14 and heated by the RF coil 33 to a temperature of about 700° C. A vapor-phase growth was effected by supplying through the gas inlet 20 down the reactor a mixed gas whose whole amount of flow reaches 15 l/min, the mixed gas comprising 4.62% trimethyl gallium diluted with hydrogen from the supply source, a 5% arsine gas (600 ml/min) diluted from hydrogen from the supply source, and a hydrogen gas (carrier gas) from the supply source. A growth time was set to 60 minutes to obtain gallium-arsenide vapor-phase growth layers of about 10 $\mu m$ in thickness.

Figure 3A:
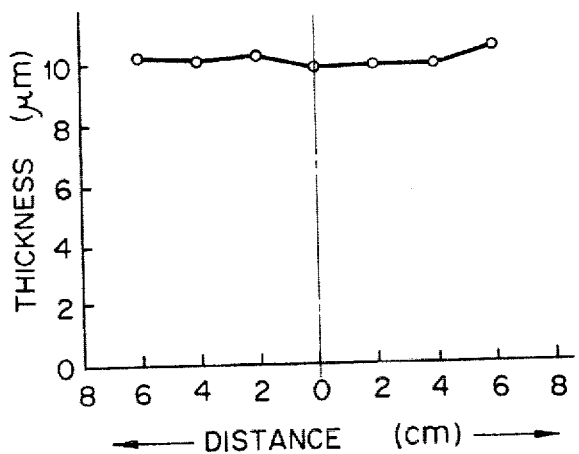
FIGS. 3A and 3B are graphs respectively showing a relation of a variation of electron concentrations and a variation in the thickness of gallium arsenide growth layers as to the position within the apparatus of FIG. 1.
Figure 3B:
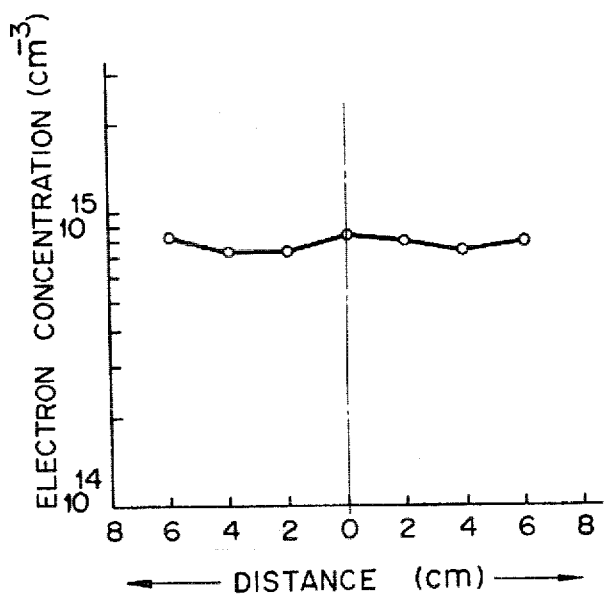
Figure 4A:
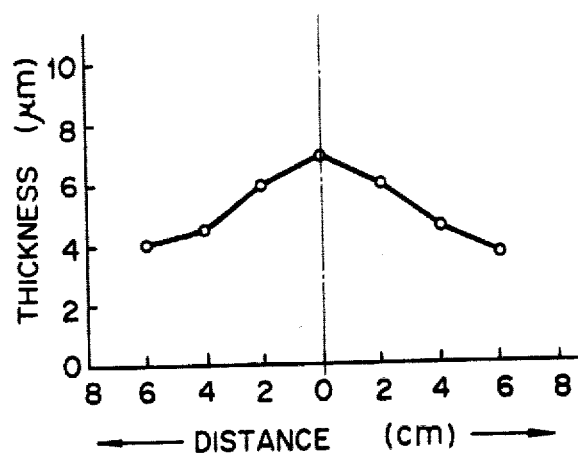
FIGS. 4A and 4B are graphs, similar to those of FIGS. 3A and 3B, respectively showing a relation of a variation of electron concentration and a variation in the thickness of gallium arsenide growth layers to the position within a conventional apparatus.
Figure 4B:
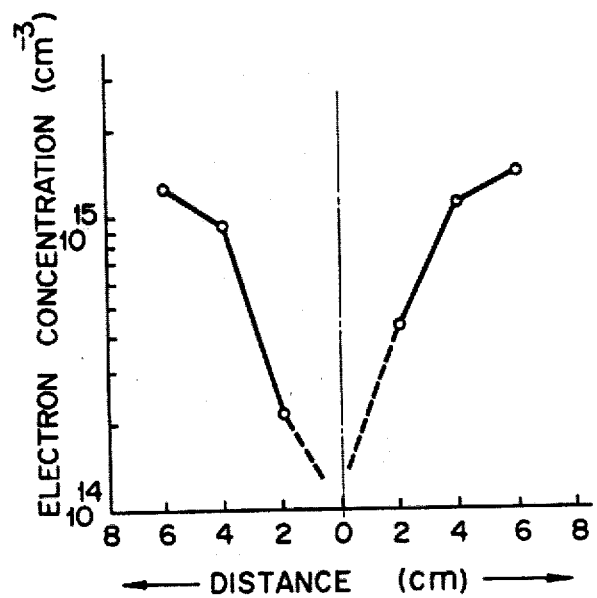

Measurements were made of a variation in thickness of the growth layers as measured from the reactor center and a variation in the concentration of electrons, the results of which are shown in FIGS. 3A and 3B. For comparison, tests were conducted under the identical conditions except that use was made of a conventional cylindrical reactor with a uniform inner diameter i.e. with no separation of upper and lower sections or chambers. The results of the test are shown in FIGS. 4A and 4B. Upon comparison between FIG. 3A and FIG. 4A it will be seen that the growth layer formed according to the method of this invention has a thickness of 10 $\mu m \pm 0.5$ $m\mu m$. The thickness of the growth layer formed according to the conventional method was 7 $\mu m$ at maximum and there is a tendency that the growth layer becomes thinner as it comes off the center of the reactor. Therefore, a longer time is necessary to obtain a desired 10 $\mu m$-thick growth layer and, even in this case, only those layers formed near the center of the reactor are usable. Upon comparison between FIG. 3B and FIG. 4B it will be understood that in the method of this invention the concentration of electrons is $8 \times 10^{14}/cm^3$ at its center with a variation of ±11% and that in the conventional method a very great variation of the concentration of electrons results and the growth layer has a P-type near the reactor center.

Substantially the same effect of the above-mentioned reactor of this invention can be obtained when the lateral cross-sectional area of the upper chamber is below 200 $cm^2$ and the lateral cross-sectional area of the lower chamber is below 4-times the lateral cross-sectional area of the upper chamber. If the lateral cross-sectional area of the upper chamber exceeds 200 $cm^2$ the convection of gas is prominently produced. As a result, the uniformity of the thickness of the growth layer as well as the concentration distribution of electrons shows such a tendency as shown in FIGS. 4A and 4B. The tendency also occurs when the lateral cross-sectional area of the lower chamber exceeds 4-times the lateral cross-sectional area of the upper chamber.

It has been found from the results of the tests that in order to obtain a good growth layer the following points should be considered:

(1) An area of a gap as defined between the inner surface of the reactor and the outer peripheral surface of the support and taken in the minimum cross-sectional direction of the gap is made equal to, or smaller than, the lateral cross-sectional area of the upper chamber. If such gap area is made greater than the lateral cross-sectional area of the upper chamber, convection is liable to occur, failing to obtain a good result. The above-mentioned gap area is an integrated value obtained in the minimum cross-sectional direction of the gap.

Figure 5:
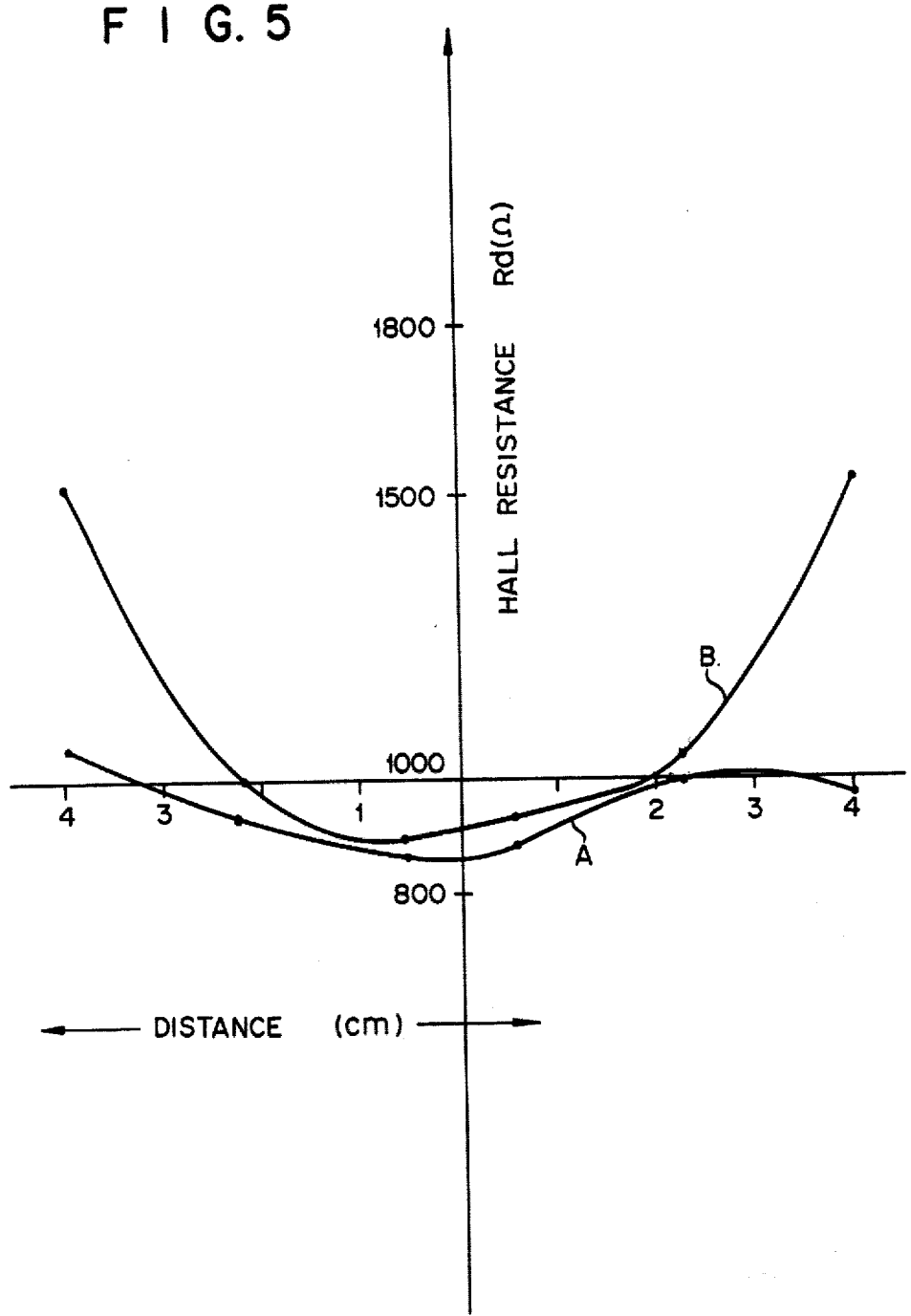
FIG. 5 is a graph showing the Hall resistance of Hall elements formed by the apparatus of this invention and the conventional apparatus.

FIG. 5 shows a variation in Hall resistance Rd($\Omega$) of Hall elements, as measured from the reactor center, which are obtained by forming vapor-phase growth layers by the same method using the reactor whose upper chamber has a lateral cross-sectional area equal to the above-mentioned gap area between the outer peripheral surface of the support and the inner surface of the reactor and the reactor whose upper chamber has a lateral cross-sectional area equal to one half the above-mentioned gap area. In FIG. 5 the curve A shows the former case and the curve B shows the latter case. From FIG. 5 it will be seen that in the former case the Hall resistance is substantially uniform irrespective of a distance from the center of the reactor.

(2) A means such as the diffusion plate is provided on the inner top wall of the upper chamber for introducing a mixed gas down into the reactor.

(3) The height of the upper chamber is made 1.5 to 2.5 times the diameter of the upper chamber.

(4) In the growth of gallium arsenide the concentration of organic gallium in the mixed gas introduced into the reactor is 0.005 to 0.05% by volume based on the hydrogen gas. For the connection of below 0.005% a great variation in the electron concentration of the growth layer is involved. If the concentration exceeds 0.005% a variation in the electron concentration occurs and the crystal state on the surface of the growth layer is degraded.

EXAMPLE 2

A vapor-phase growth was carried out, while varying the concentration of TMG, under the following conditions:
 (i) growth temperature: 720° C.
 (ii) $AsH_3$/TMG molar ratio: 15
 (iii) $H_2S$/TMG molar ratio: 0.001
 (iv) carrier gas: hydrogen gas
 (v) flow rate of a mixed gas: 1 cm/sec. FIG. 6 shows the distribution of the electron concentration of the growth layer obtained by this test.

(5) The flow rate of the mixed gas is 0.5 to 4 cm/sec. If the flow rate is outside this range the crystallinity is degraded and there is involved a tendency for lowered mobility.

EXAMPLE 3

FIG. 7 shows the mobility of a growth layer formed by effecting the vapor-phase growth of gallium arsenide, while varying the flow rate of a mixed gas, under the following conditions:
 (ii) concentration of TMG: 0.02%
 (iii) $AsH_3$/TMG molar ratio: 15
 (iv) $H_2S$/TMG molar ratio: 0.001

(6) The mixed gas in the reactor is maintained at a pressure of below 100 mm Ag.

The interior of the growth reactor is separated into the upper chamber having a lateral cross-sectional area of below 200 cm$^2$ and the lower chamber having a lateral cross-sectional area greater than, but smaller than 4-times, the lateral cross-sectional area of, the upper chamber and a vapor-phase growth occurs on the sample on the support within the lower chamber of the reactor by the mixed gas flowing down the reactor. Thus, there hardly occurs the convection of the mixed gas and high-purity growth layers can be formed at uniform thickness merely by supplying a smaller amount of gas. Since the lower chamber of the reactor has a greater lateral cross-sectional area a greater number of vapor-phase growth layers can be formed one at a time; permitting mass-production, an advantage of the thermal-cracking vapor-phase method.

Although the vapor-phase growth apparatus of this invention is applied to the gallium-arsenide vapor-phase growth method using organic gallium and hydrogen arsenide, this invention can be applied to a gallium-arsenide vapor-phase growth method using the other material. This invention is also applicable to a vapor-phase growth method using a compound semiconductor other than gallium arsenide.

What is claimed is:

1. A vertical type vapor-phase growth apparatus comprising a vapor-phase growth reactor constituted of an upper section defining an upper chamber having a lateral cross-section of below 200 cm$^2$, a lower section defining a lower chamber having a lateral cross-sectional area greater than, but smaller than four-times the cross-sectional area of, the upper chamber, and a jointing section connecting together the upper and lower sections; a support disposed within the lower chamber and on which a sample is placed, said upper chamber, jointing section and lower chamber lacking gas flow restrictions therebetween; and means for conducting a gas for vapor-phase growth into the upper chamber of the reactor, wherein said support is provided within the lower chamber and near the upper chamber such that an area of a gap as defined between the outer peripheral surface of the support and the inner surface of the reactor and taken in the minimal cross-sectional direction of the gap is made equal to, or smaller than, the lateral cross-section of the upper chamber, wherein said means for conducting a gas into the upper chamber of the reactor comprises gas supply means, a gas introducing duct for supplying the gas from said gas supply means into the upper chamber of the reactor, and gas diffusion means for diffusing the gas from said gas introducing duct, wherein the upper and lower chambers of the reactor are provided concentric with the support, and wherein said support has a silicon plate upon which a sample is directly placed.

2. A vertical type vapor-phase growth apparatus according to claim 1 in which said gas diffusion means is provided concentric with the upper chamber of the reactor and near an outlet of said gas introducing duct and has a circular diffusion plate having a lateral cross-sectional area smaller than that of the upper chamber of the reactor.

3. A vertical type vapor-phase growth apparatus according to claim 1, further including rotating means by which said support is rotated with a shaft as a center.

4. A vertical type vapor-phase growth apparatus according to claim 3 in which the upper chamber of the reactor has a height 1.5 to 2.5 times the diameter of said upper chamber.

5. A vertical type vapor-phase growth apparatus according to claim 3, in which said gas supply means has a hydrogen gas supply source and organic gallium supply source, and a gas introducing duct supplies to an upper chamber of a reactor 0.005 to 0.05% by volume of organic gallium based on a hydrogen gas.

6. A vertical type vapor-phase growth apparatus according to claim 4, in which the gas supply means has an organic gallium supply source, a hydrogen arsenide supply source and a carrier gas supply source and a gas introducing duct supplies a mixed gas including organic gallium, hydrogen arsenide and a carrier gas into said upper chamber of said reactor at a flow rate of 0.5 to 4 cm/second.

* * * * *